ically Patent Number: 4,597,038
Date of Patent: Jun. 24, 1986

United States Patent [19]
Stacey

[54] SWITCHING OVERLAP PROTECTION BY CONTROL GATE IMPEDANCE MONITORING

[75] Inventor: Eric J. Stacey, Penn Hills, Pa.

[73] Assignee: Westinghouse Electric Corp., Pittsburgh, Pa.

[21] Appl. No.: 634,731

[22] Filed: Jul. 26, 1984

[51] Int. Cl.[4] .............................................. H02H 7/12
[52] U.S. Cl. .................................. 363/56; 307/252 C; 340/645; 363/57
[58] Field of Search .................... 307/252 C; 340/644, 340/645, 653; 363/56, 57, 58, 68, 96

[56] References Cited

U.S. PATENT DOCUMENTS

| | | | |
|---|---|---|---|
| 4,155,113 | 5/1979 | Simmons | 363/56 |
| 4,231,083 | 10/1980 | Matsuda et al. | 363/96 |
| 4,342,076 | 7/1982 | Rosswurm et al. | 363/56 |
| 4,456,949 | 6/1984 | Incledon | 363/56 |

FOREIGN PATENT DOCUMENTS 59-17861  1/1984  Japan ................................ 363/138

Primary Examiner—William H. Beha, Jr.
Assistant Examiner—J. Sterrett
Attorney, Agent, or Firm—R. P. Lenart

[57] ABSTRACT

In a power converter switching system, the instantaneous blocking ability of semiconductor switching elements is determined by monitoring the reverse blocking ability of a control junction in each switching device. A gate firing circuit applies negative turn-off drive to the control junction. The control junction impedance is monitored and switch recovery is indicated by a change in the magnitude of the impedance. A switch recovery logic signal is then generated and used to initiate the firing of the next successive switch element. When switches are combined in multipulse groups, the recovery signals may be logically combined to provide proper switching coordination, emergency protection and diagnostic information.

6 Claims, 8 Drawing Figures

SWITCHING OVERLAP PROTECTION BY CONTROL GATE IMPEDANCE MONITORING

BACKGROUND OF THE INVENTION

This invention relates to semiconductor switching circuits and more particularly to semiconductor switching circuits in switching power converters.

In all switching power converters, it is important to accurately coordinate operation of the power stage switching devices. Converters employing switching devices with intrinsic turn-off capability, generally require that no conduction overlap is allowed. In practice, some underlap is usually employed. To avoid the buildup of high voltages across the switching devices, the underlap is usually kept short.

In practical power converters employing bipolar devices, such as thyristors, transistors or gate turn-off (GTO) thyristors, switching delays due to charge storage must be addressed. At turn off, the storage delays are current dependent and may exceed the maximum allowable underlap. A fixed gap between consecutive switching control signals will not always be satisfactory.

Since the turn on delays are relatively short, switching overlap can be avoided if turn off or recovery of a switching device is detected and then used immediately to initate firing of the next device. This technique is illustrated in U.S. Pat. No. 4,342,076, issued July 27, 1982 to Rosswurm et al. wherein transistor switch current is sensed by a change in voltage level of a secondary winding of a transformer in the base drive circuit and completion of turn off of the transistor is used to produce a signal which initiates turn on of another associated transistor.

While this approach is satisfactory in some applications, it does not provide a continuous indication of the conduction status of each switching device which can be used for system diagnostic purposes.

SUMMARY OF THE INVENTION

The present invention provides a method and apparatus which prevents switching overlap by monitoring the reverse blocking capability of the control junction of a semiconductor switch to determine switch recovery. Solid state switching circuitry constructed in accordance with this invention comprises: a first solid state switching device having a control electrode connected to a control junction and a main conduction path that passes or blocks current flow in response to control current in the control junction wherein the main conduction path is connected to switch current between an input terminal and an output terminal; a first driving means for selectively applying positive and negative control current through the first device control junction; means for monitoring the impedance of the first switching device control junction wherein the impedance exhibits a change from a first magnitude to a second magnitude upon completion of the turn-off period of the first switching device following a transition in polarity of the control current supplied by the first driving means; and a second driving means for initiating a turn on signal for a second solid state switching device in response to the change in impedance of the first device control junction.

Switching circuits constructed in accordance with this invention alternately turn on a plurality of solid state switching devices by a method which comprises the steps of: monitoring the impedance of a control junction in a first solid state switching device, having a control electrode connected to the control junction and a main conduction path that passes or blocks current in response to control current in the control junction, wherein the control junction impedance exhibits a change from a first magnitude to a second magnitude upon completion of a turn-off period following a transition in polarity of the control current in the control junction; and applying a turn on signal to a control junction of a second solid state switching device in response to the change in impedance in the first device control junction.

DESCRIPTION OF THE PREFERRED EMBODIMENTS

Figure 1:
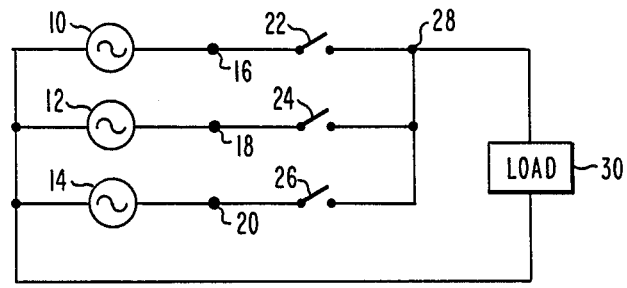
FIG. 1 is a schematic diagram of a power converter which may incorporate the switching circuit and method of the present invention.

Referring to the drawings, FIG. 1 is a schematic diagram of a three pulse switching power converter which may incorporate the switching circuit and method of the present invention. In this converter, three AC generators 10, 12 and 14, which may represent the phases of a three-phase power system are shown to be connected to deliver power to input terminals 16, 18 and 20 respectively. Switches 22, 24 and 26 are used to sequentially conduct current from the input terminals to an output terminal 28. Power is then delivered to load 30 from the output terminal 28. It should be apparent that simultaneous conduction of any two switches in FIG. 1 would result in a direct shorting of the input phases with catastrophic results.

Figure 2:
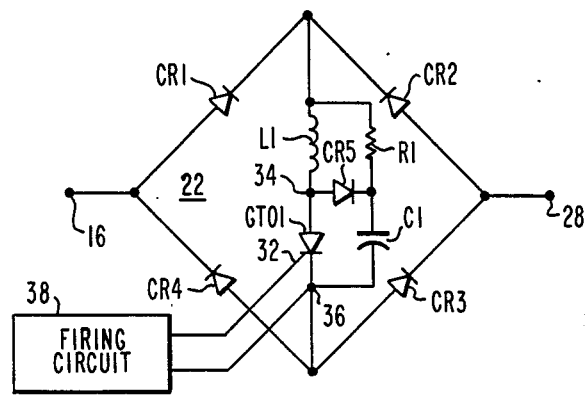
FIG. 2 is a schematic diagram of a switch circuit for use in the system of FIG. 1.

FIG. 2 is a schematic diagram of a switch which may be used in the circuit of FIG. 1. In this embodiment, each switch comprises a gate turn-off thyristor GTO1 and a bridge rectifier including diodes CR1, CR2, CR3, and CR4. Resistor R1, inductor L1, capacitor C1 and diode CR5 are used to limit the change in current with respect to time (di/dt) and the change in voltage with respect to time (dv/dt) of the gate turn-off thyristor GTO1. Thyristor GTO1 includes a gate or control electrode 32 which is connected to a control junction within the thyristor and a main conducting path which alternately passes or blocks current between terminals 34 and 36. The control junction impedance changes from a first magnitude when the thyristor main conducting path is passing current to a second magnitude when the thyristor has recovered to the current blocking mode. Firing circuit 38 includes a monitoring means which determines when thyristor GTO1 is beginning to recover or has recovered the reverse blocking capability of its control junction. It should be understood that although a gate turn-off thyristor is used as the semiconductor switching device in this embodiment, other semiconductor switching devices which include a control junction may also be used in this invention. In a thyristor, the control junction is the gate to cathode junction while in a bipolar transistor, the control junction is the base to emitter junction.

Figure 3:
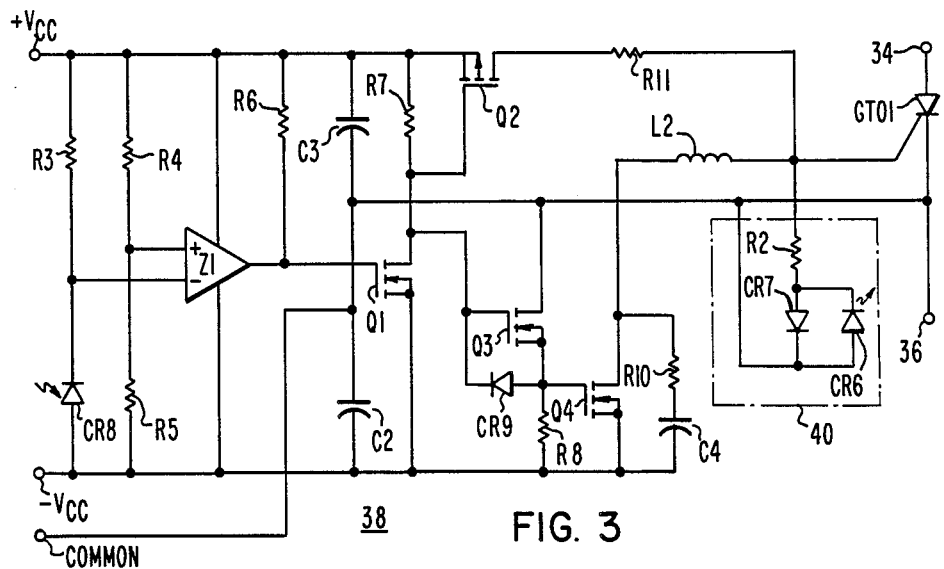
FIG. 3 is a schematic diagram of the firing circuit of FIG. 2.

FIG. 3 is a schematic diagram of the firing circuit 38 in FIG. 2. This circuit uses an external isolated power source $V_{CC}$ and a fiber optic control input. When a semiconductor switching device such as GTO1 is conducting current along its main conducting path or has not recovered its current blocking ability, it will allow reverse current flow in its control junction. Since positive gate drive turns on the solid state switch and negative gate drive is employed for turn off in power switching applications, recovery detection of the switching device can be accomplished by monitoring the impedance of the control junction. In this embodiment, the control junction impedance monitoring means 40 comprises a branch circuit which includes the series connection of resistor R2 and light emitting diode CR6. This branch circuit is connected across the control junction by being connected between the gate and cathode of GTO1 and is used to sense reverse gate voltage and to provide a switch recovery logic signal in the form of light which is transmitted through a fiber optic isolator. Being intimately associated with the gate of GTO1, the recovery detector components may be mounted on the firing circuit thereby minimizing the length of all connections. This is important to minimize stray radiation from the gate lead, which can oscillate at high frequency just after turn off, when the gate cathode junction comes out of avalanche. Light emitted from light emitting diodes CR6 is transmitted by way of a fiber optic cable to one of the input photodiodes in the switch recovery detection circuit of FIG. 4. The use of fiber optic isolators rather than integrated electro-optic isolators is recommended if the detrimental effects of high frequency oscillation and high common mode dv/dt are to be avoided without sacrificing speed of response.

The primary function of the protective logic circuits of the present invention is to coordinate switch operation to prevent excessive switch voltage and shoot through, that is, to ensure that one switch in a group is off before the next one is turned on, while minimizing the delay between successive switch conduction periods. Optional secondary functions can provide indications of failed or slow turn-off devices and can initiate a safe emergency shutdown sequence in the case of a switch failure. For all of these functions, the only logic inputs required are the firing request signals generated by the main converter control and the switch recovery signals derived from the control junction monitoring circuit. The optical output of the recovery detector circuit diode CR6 in FIG. 3 is converted back to a logic signal by receiver circuits as shown in the schematic diagram of FIG. 4. For a three pulse converter, the optical recovery signals are received by photodiodes CR10, CR11, and CR12 to produce logic low signals which are inverted by inverters Z2, Z3 and Z4 to logic high levels and appear as logic switch recovery signals on terminals 42, 44 AND 46. These switch recovery signals are also transmitted to and gates Z5, Z6 and Z7 wherein they are combined with a logic start signal from terminal 48 and logic firing request signals which have been delivered to terminals 50, 52 and 54 by the main converter control 56. The outputs of AND gates Z5, Z6 and Z7 are inverted by inverters Z8, Z9 and Z10 and served to produce firing signals in the form of optical outputs from light emitting diodes CR13, CR14 and CR15.

Figure 5:
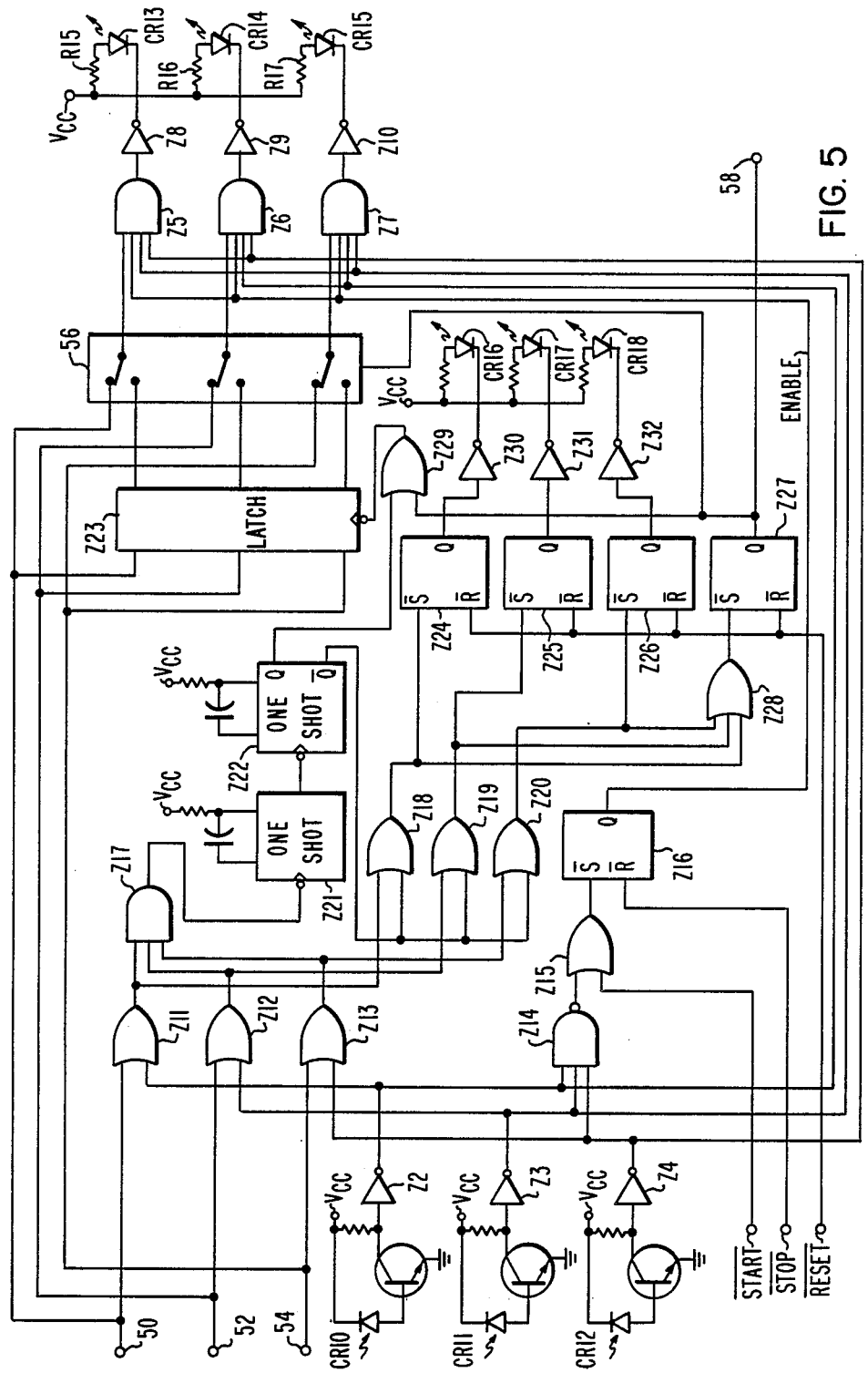
FIG. 5 is a schematic diagram of a switching coordination circuit, which includes fault location indication and protection logic, for use in combination with the switches of FIG. 1.

To provide more comprehensive protection which can indicate the location of a failing or failed switch, and initiate a predetermined emergency alarm and/or shutdown sequence, additional logic is required. An arrangement combining circuitry to indicate the location of a failed device, to freeze the firing signals and to initiate breaker tripping for a three pulse converter is shown in FIG. 5. Start, stop and reset inputs are also provided. The start function will be inhibited unless all recovery signals are active. The stop input is used to shut off switches and would, of course, normally be activated when the converter current is small to prevent a build-up of high voltages. The reset input is used to deactivate all latched indicators after a fault.

The logic shown in FIG. 5 performs the following functions:

1. It coordinates the operation of the three pulse group of switches as shown in FIG. 1 in exactly the same manner as the simpler logic of FIG. 4.

2. It enables the firing to be independently started or stopped whenever firing request signals are present and no fault conditions exit.

3. It "searches" for excessive recovery time of each switch in turn by determining if the time between a change in polarity of the control current and the resulting switch recovery exceeds a preset limit, and indicates which if any are abnormally slow. If this is the case it then:

(a) Indicates which switch is at fault;
(b) Returns the firing control signals to previous state so that the slow recovering devices turn on gate drive is restored and held on; and
(c) Generates a logic signal to trip a breaker, sound an alarm, or initiate some other emergency action.

When a fault has been indicated, normal operation can only be resumed after the fault has been cleared and the RESET input has been activated.

Referring to FIG. 5, under normal operating conditions:

the output of latch Z16 is high;
the output of latch Z27 is low;
the outputs of Z24, Z25 and Z26 are all low;
all visible LED fault indicators CR16, CR17 and CR18 are off; and
the analog switch 56 is in the position shown.

Figure 4:
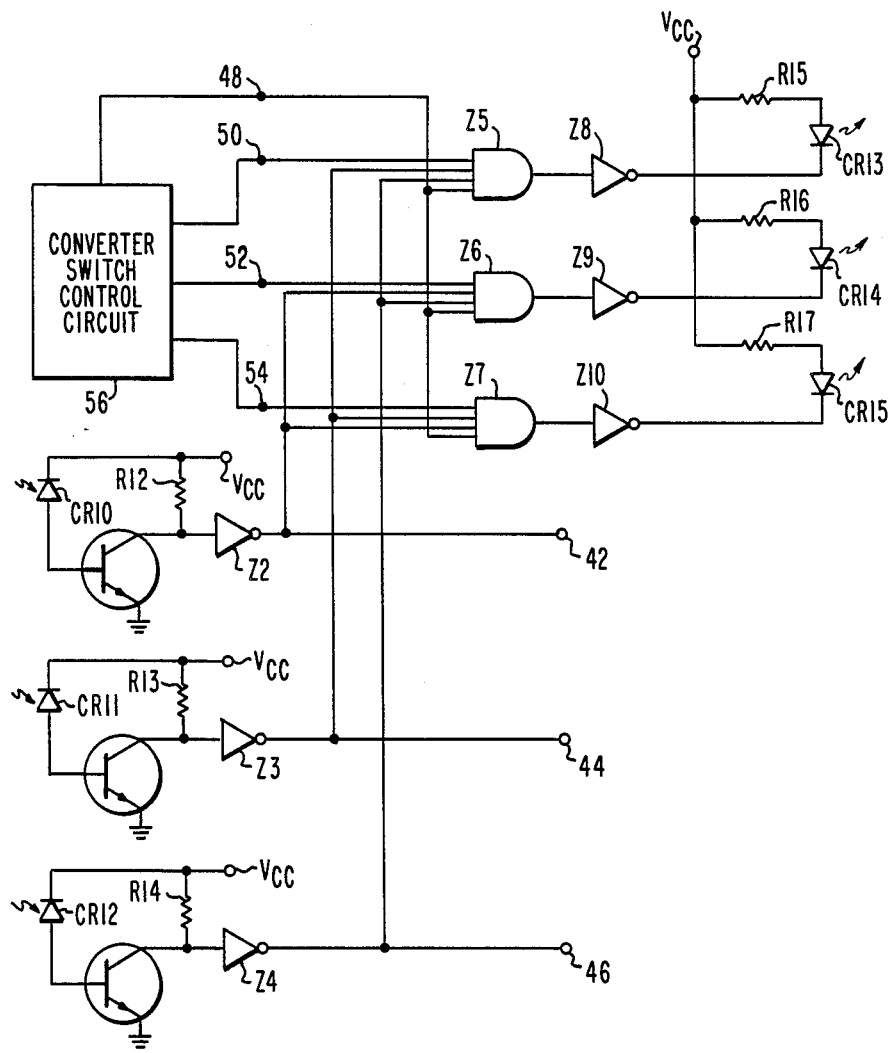
FIG. 4 is a schematic diagram of recovery detection receivers and switch coordination logic for use in combination with the switches of FIG. 1.

In normal operation the firing request signals which have been delivered to terminals 50, 52 and 54 are logically combined with the recovery detector signals obtained at the outputs of Z2, Z3 or Z4 in exactly the same manner as described for FIG. 4.

The output of the recovery detection signal for each device is logically OR'ed with its own firing request signal in OR gates Z11, Z12 and Z13 to obtain outputs which remain low for the duration of the recovery of each device.

Figure 6:
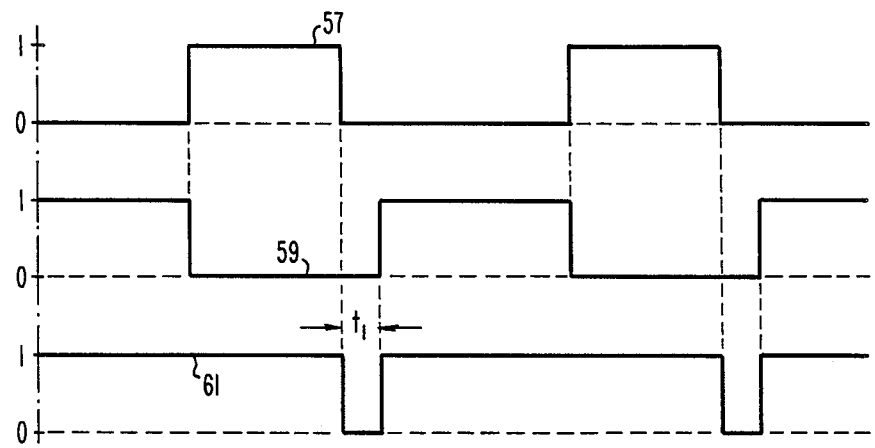
FIG. 6 is a series of waveforms which ilustrate the operation of the circuit of FIG. 5.

The signals corresponding to switch 22 in FIG. 1 are as shown in FIG. 6, wherein waveform 57 represents a firing request signal at terminal 50; waveform 59 is the output of inverter Z2; waveform 61 is the output of OR gate Z11; and t₁ is the recovery period of the associated switch. The outputs of OR gates Z11, Z12 and Z13 in FIG. 5 are logically combined with AND gate Z17 which produces a negative edge triggering pulse for the one-shot Z21 at the start of each recovery period. The timing of this one-shot is set to correspond to the maximum safe recovery time for the power switching devices, and its output is used to trigger one-shot Z22 which produces a short pulse at the end of the safe recovery time.

If recovery is not complete when Z22 produces its pulse, one of the OR gates Z18, Z19 or Z20 will transmit the pulse to the $\overline{S}$ input of the corresponding latch Z24, Z25 or Z26 and cause the corresponding LED indicator to light up. The pulse from Z22 also will be transmitted through OR gate Z28 to latch Z27 whose output 58 is the signal to trip off the breaker. The output of Z27 also drives the analog switches 56 which now select the latched outputs of Z23 as firing signals.

During normal operation the outputs of the data latch Z23 are normally clocked to follow the firing request signals on terminals 50, 52 and 54, at the end of the pulse output from Z22 which occurs after Z21 times out. When a fault occurs the negative edge clocking of Z23 is inhibited because the latched output of Z27 causes it to stay high. The actual firing signals that are then transmitted via Z5, Z6 and Z7 which return to the previously requested set, and will be held there until latch Z27 is reset by a momentary "low" signal at the $\overline{RESET}$ input.

Providing all recovery signals are present at the outputs of Z2, Z3 and Z4, the start latch may be set by a START signal to enable outputs to be transmitted through Z5, Z6 and Z7. If any recovery signal is not high, NAND gate Z14 and OR gate Z15 prevent the START signal from being effective. Firing signals can be shut off at any instant when a logic low is applied to the $\overline{STOP}$ input.

FIG. 5 is included to illustrate one way in which this recovery detection may be combined with logic to provide diagnostic and protective functions. It should be understood that other combination schemes can also be implemented in accordance with this invention.

Figure 7:
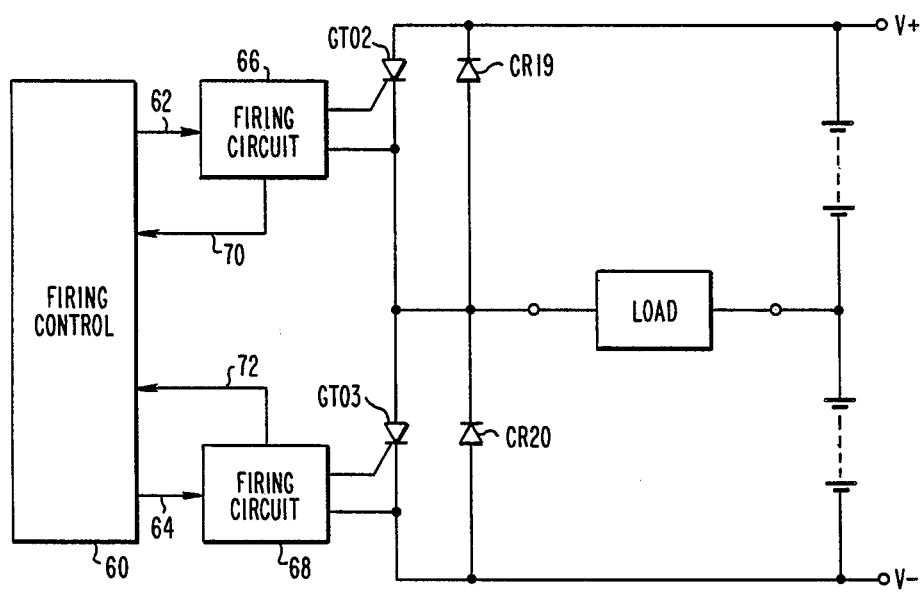
FIG. 7 is a schematic diagram, partially in block diagram form, of an inverter circuit which may incorporate the present invention.

FIG. 7 is a schematic diagram of an inverter power pole switching circuit which utilizes the present invention to provide shoot through prevention, prior fault indication and emergency shut off. In this circuit, a firing control 60 provides firing request signals for gate turn-off thyristors GTO2 and GTO3 on data lines 62 and 64 respectively. Firing circuits 66 and 68 produce firing pulses for the gate control electrodes of the thyristors and also monitor the control junction impedances through a circuit which is similar to that of FIG. 3. Signals which indicate thyristor recovery are fed back to firing control 60 along data lines 70 and 72. The switch control, fault indication and emergency shut off features of this invention are provided by the logic circuit of FIG. 8.

Figure 8:
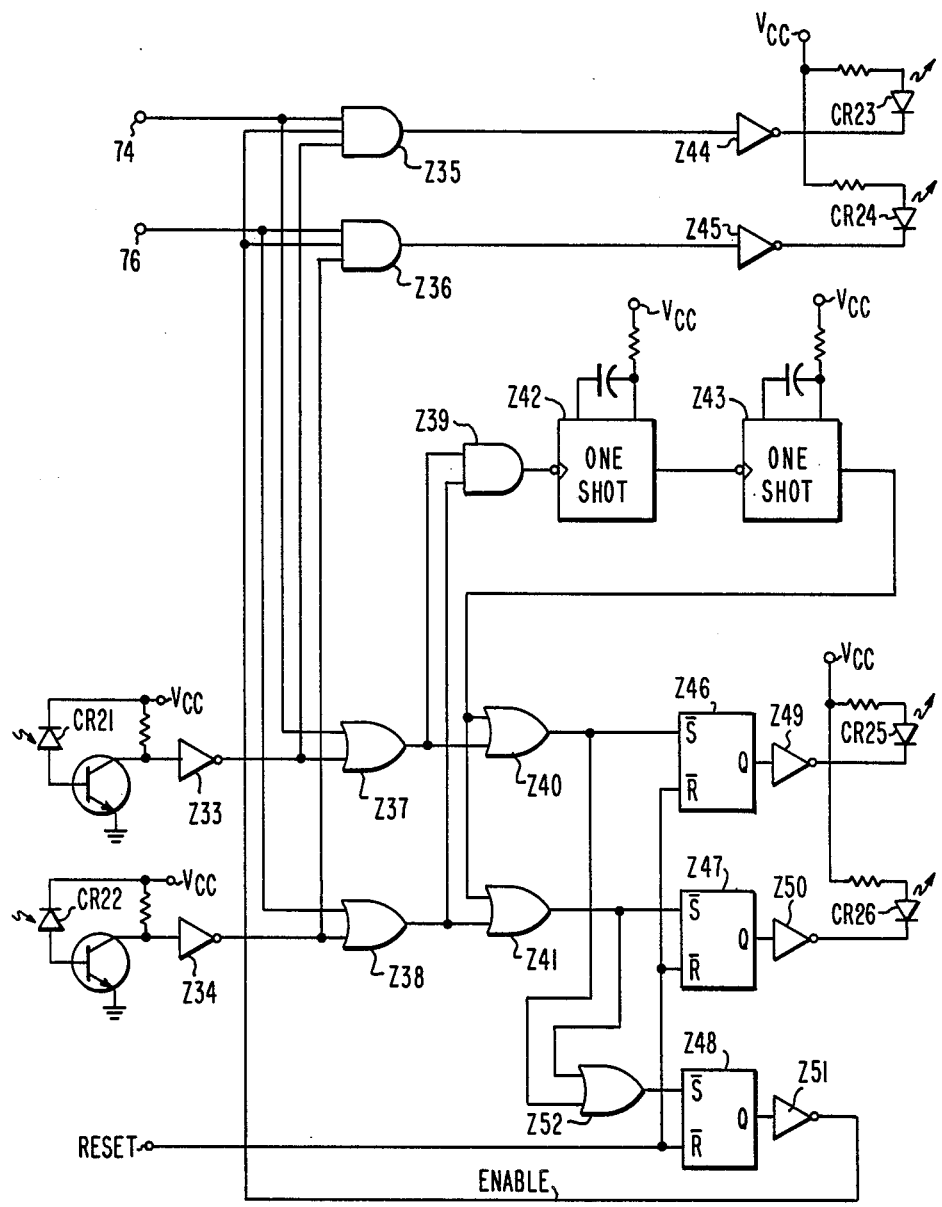
FIG. 8 is a schematic diagram of the logic control circuit utilized in combination with the circuit of FIG. 5.

FIGS. 7 and 8 illustrate how recovery detectors may be used with protective logic for the power pole switches of an inverter.

The two switches, GTO2 and GTO3 in FIG. 7 conduct alternately and must never conduct at the same time. Complementary firing request signals applied to terminals 74 and 76 of FIG. 8 are prevented from firing the corresponding devices GTO2 and GTO3 unless recovery of the complementing device is complete. Recovery of GTO2 is monitored by CR21 and Z33 and recovery of GTO3 is monitored by CR22 and Z34.

Firing of GTO2 is only permitted by AND gate Z35 when the ENABLE input from Z51 is high and when the Z33 output is also high. Similarly firing of GTO3 is only permitted when the outputs of Z51 and Z34 are both high.

In addition to the above interlocking logic, gates Z37 and Z38 are used to develop digital signals representing the actual recovery periods for the two GTO's. The output of Z37 will remain low when GTO2 is recovering and the output of Z38 will remain low when GTO3 is recovering. These two recovery circuits are combined with AND gate Z39 to trigger one-shot Z42 at the start of each recovery period.

The output pulse duration from Z42 is set to the mzximum safe recovery time for the GTO's, and the trailing edge of this pulse triggers a second one-shot Z43. The short, negative going, pulse produced by Z43, is OR'ed with the output of Z37 in OR gate Z40 whose output is normally positive but will go negative if the recovery of GTO2 exceeds the safe recovery time (i.e. when the output of Z43 is triggered). OR gate Z41 is used similarly to detect excessive recovery time of GTO3 when the output of Z38 and Z43 would both go to zero.

If an excessive recovery time is detected by Z40 or Z41 then LATCH Z48 is set via OR gate Z52, the output of Z51 which is normally high will be set low and the firing signal to both GTO's will be set off by AND gates Z35 and Z36.

Depending on which GTO is slow recovering, LATCH Z46 or Z47 will be SET and the corresponding LED will be lit, indicating which device initiated the protective action.

Once the latches have been set no GTO firing will be possible until the three latches are reset by the $\overline{RESET}$ input.

Since inverter switching devices can usually be clamped to the DC input level, emergency shut off can occur at any level of current. Switching device faults are detected by measurement of the recovery time, which is directly related to the current. Separate alarm and shut down functions can be easily provided.

It should be apparent that the present invention enables continuous real-time monitoring of all semiconductors switching devices in a power converter. Complete electrical isolation may be provided by fiber optic links, and switching recovery may be detected at any level of current, including zero. If switch characteristics are known, the outputs of the recovery detector may be used to indicate a current level. The logic circuitry used to implement the present invention can easily detect the location of a slow recovery or failed switching device. Separate fault indication and shutdown levels may be provided. This invention insures that in any group of switches, only one switch at a time will be fired, even if the control malfunctions and requests simultaneous firings. In addition, all switches can be monitored in the standby mode and startup can be inhibited if any switch is not recovered.

Although the present invention has been described in terms of what are at present believed to be its preferred embodiments, it will be apparent to those skilled in the art that various changes may be made without departing from the scope of this invention which is defined by the appended claims.

What is claimed is:

1. Solid state switching circuitry comprising:
   a first solid state switching device having a control electrode connected to a control junction and a main conduction path that passes or blocks current flow in response to control current in said control junction, said main conduction path being connected to switch current between an input terminal and an output terminal;
   a first driving means for selectively applying positive and negative control current through said first device control junction;
   means for monitoring the impedance of said first switching device control junction, said impedance exhibiting a change from a first magnitude to a second magnitude upon completion of the turn-off period of said first switching device following a transition of polarity of control current supplied by said first driving means; and
   a second driving means for initiating a turn-on signal for a second solid state switching device in response to said change in impedance of said first device control junction wherein said means for monitoring the impedance of said first device control junction includes a branch circuit including a resistor and a light emitting diode connected in series, said branch circuit being connected across said first device control junction such that said light emitting diode emits light in response to said change in impedance of said first device control junction.

2. Switching circuitry as recited in claim 1, further comprising:
   means for determining if the time interval between said transition in polarity of control current supplied by said first driving means and said change in impedance of said first device control junction exceeds a preselected time.

3. Switching circuitry as recited in claim 1, further comprising:
   means for generating a logic firing request signal for each of said switching devices, wherein said first and second driving means provide control current to said first and second switching devices in response to said logic firing request signals; and
   means for blocking the logic firing request signal for said second switching device until said first switching device has completed its turn-off period.

4. Switching circuitry as recited in claim 3, further comprising:
   a light responsive device for producing a logic switch conduction status signal for said first switching device in response to the presence or absence of light from said light emitting diode.

5. Switching circuitry as recited in claim 1, wherein said second solid state switching device includes:
   a control electrode connected to a control junction and a main conduction path that passes or blocks current flow in response to control current in said control junction, said main conduction path being connected to control current flow between a second input terminal and said output terminal.

6. Switching circuitry as recited in claim 5, further comprising:
   means for monitoring the impedance of said second switching device control junction, said impedance exhibiting a change from a first magnitude to a second magnitude upon completion of the turn-off period of said second switching device following a transition in polarity of control current supplied by said second driving means;
   said means for monitoring the impedance of said second switching device control junction including means for producing a second switch recovery logic signal in response to said change in impedance of said second switching device control junction;
   means for preventing each driving means from applying current to the associated one of said switching devices; and
   means for determining the conduction status of each of said switching devices by comparing the switch recovery logic signals representative of each control junction impedance magnitude, in the absence of control current, with a predetermined logic signal.

* * * * *